United States Patent
Huang et al.

(10) Patent No.: US 10,957,718 B2
(45) Date of Patent: Mar. 23, 2021

(54) PIXEL STRUCTURE

(71) Applicant: Au Optronics Corporation, Hsinchu (TW)

(72) Inventors: Pu-Jung Huang, New Taipei (TW); Pin-Miao Liu, Hsinchu County (TW); Cheng-Yeh Tsai, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/594,077

(22) Filed: Oct. 7, 2019

(65) Prior Publication Data

US 2020/0185415 A1    Jun. 11, 2020

(30) Foreign Application Priority Data

Dec. 6, 2018  (TW) .................................. 107143901

(51) Int. Cl.
*H01L 27/12* (2006.01)
*H01L 27/06* (2006.01)
*H01L 25/16* (2006.01)

(52) U.S. Cl.
CPC .......... *H01L 27/124* (2013.01); *H01L 25/167* (2013.01); *H01L 27/0617* (2013.01)

(58) Field of Classification Search
CPC .................................................... H01L 27/124
See application file for complete search history.

(56) References Cited

U.S. PATENT DOCUMENTS

| 7,994,523 | B2 | 8/2011 | Lee et al. | |
| 8,399,895 | B2 * | 3/2013 | Shakuda | H01L 33/385 |
| | | | | 257/93 |
| 8,835,929 | B2 | 9/2014 | Xi et al. | |
| 8,987,744 | B2 | 3/2015 | Xi et al. | |
| 9,899,427 | B2 | 2/2018 | Chen et al. | |
| 2006/0231852 | A1 * | 10/2006 | Kususe | H01L 33/385 |
| | | | | 257/99 |
| 2008/0217629 | A1 | 9/2008 | Lee et al. | |
| 2014/0077211 | A1 | 3/2014 | Xi et al. | |

(Continued)

FOREIGN PATENT DOCUMENTS

| CN | 101305475 | 11/2008 |
| CN | 105261655 | 1/2016 |

(Continued)

*Primary Examiner* — William A Harriston
(74) *Attorney, Agent, or Firm* — JCIPRNET (57) ABSTRACT

A pixel structure including a first light-emitting diode element, a second light-emitting diode element and a first interconnection pattern is provided. The first interconnection pattern is disposed on and electrically connected to a first electrode of the first light-emitting diode element and a first electrode of the second light-emitting diode element. The first interconnection pattern is configured to be electrically connected to a drive element. The first interconnection pattern includes a first main portion and a second main portion. The first main portion extending in a first direction is disposed on the first electrode of the first light-emitting diode element. The second main portion extending in a second direction and connected to the first main portion is disposed on the first electrode of the second light-emitting diode element. The first direction and the second direction are crossed.

19 Claims, 6 Drawing Sheets

(56) References Cited

U.S. PATENT DOCUMENTS

| | | |
|---|---|---|
| 2014/0339554 A1 | 11/2014 | Xi et al. |
| 2016/0343772 A1 | 11/2016 | Bower et al. |
| 2017/0229482 A1 * | 8/2017 | Chen .................... H01L 25/167 |
| 2019/0172761 A1 | 6/2019 | Guo et al. |

FOREIGN PATENT DOCUMENTS

| | | | |
|---|---|---|---|
| CN | 108447883 | | 8/2018 |
| CN | 108447883 A | * | 8/2018 |
| TW | 201729394 | | 8/2017 |
| TW | I641126 | | 11/2018 |

* cited by examiner

PIXEL STRUCTURE

CROSS-REFERENCE TO RELATED APPLICATION

This application claims the priority benefit of Taiwan application serial no. 107143901, filed on Dec. 6, 2018. The entirety of the above-mentioned patent application is hereby incorporated by reference herein and made a part of this specification.

BACKGROUND OF THE INVENTION

1. Field of the Invention

The present invention relates to a pixel structure, and in particular, to a pixel structure including a plurality of light-emitting diode elements.

2. Description of Related Art

With the development of display technologies, thin display devices with a high resolution are popular in the mainstream market. In recent years, due to a breakthrough in manufacturing technologies of light-emitting diode (LED) elements, micro LED display devices or millimeter-grade LED display devices, or the like that can be manufactured by arranging LED elements in an array are developed. A liquid crystal layer and a color filter do not need to be provided in the devices, and thicknesses of the display devices can be further reduced. In addition, compared with an organic light-emitting diode display device, the LED display device has advantages of power saving and longer service life.

Currently, in a manufacturing process of the micro LED display device, a large number of LED elements are transferred to another substrate by mass transfer. However, today's display devices are generally provided with millions of pixels, and LED elements are small in size and difficult to precisely pick up and align. Consequently, the LED elements cannot be accurately placed at a preset position due to alignment errors, leading to a problem that the LED elements cannot be driven normally. In other words, currently, a manufacturing yield of the micro LED display device is low. Moreover, unevenness of the brightness of the LED elements may be caused by process variations.

SUMMARY OF THE INVENTION

The present invention provides a pixel structure, so that a manufacturing yield can be improved and the degree of unevenness of the brightness of light-emitting diode elements caused by process variations can be reduced.

The present invention provides a pixel structure, including a plurality of light-emitting diode elements and a first interconnection pattern. The plurality of light-emitting diode elements is disposed above a substrate. The plurality of light-emitting diode elements includes a first light-emitting diode element and a second light-emitting diode element. Each light-emitting diode element includes a first electrode and a second electrode. The first interconnection pattern is disposed on the first electrode of the first light-emitting diode element and the first electrode of the second light-emitting diode element. The first interconnection pattern is electrically connected to the first electrode of the first light-emitting diode element and the first electrode of the second light-emitting diode element. The first interconnection pattern is configured to be electrically connected to a drive element. The first interconnection pattern includes a first main portion and a second main portion. The first main portion is disposed on the first electrode of the first light-emitting diode element, and extends in a first direction. The second main portion is connected to the first main portion, is disposed on the first electrode of the second light-emitting diode element, and extends in a second direction. The first direction and the second direction are crossed.

In an embodiment of the present invention, the foregoing pixel structure further includes: an isolation layer. The isolation layer is disposed on the drive element, and includes a contact window. The plurality of light-emitting diode elements is disposed on the isolation layer. The first interconnection pattern is electrically connected to the drive element through the contact window, and the contact window overlaps with the first main portion of the first interconnection pattern in a vertical projection direction perpendicular to the substrate.

In an embodiment of the present invention, a width of the second main portion of the foregoing first interconnection pattern in the first direction is less than a width of the first electrode of the second light-emitting diode element in the first direction.

In an embodiment of the present invention, a width of the first main portion of the foregoing first interconnection pattern in the second direction is less than a width of the first electrode of the first light-emitting diode element in the second direction.

In an embodiment of the present invention, the foregoing first interconnection pattern further includes: a first branch portion. The first branch portion is disposed on the first light-emitting diode element, and extends in the second direction. The first main portion is connected between the first branch portion and the second main portion.

In an embodiment of the present invention, a width of the foregoing first branch in the first direction is less than a width of the first electrode of the first light-emitting diode element in the first direction.

In an embodiment of the present invention, a length of the foregoing first branch in the second direction is greater than a half of a width of the first electrode of the first light-emitting diode element in the second direction.

In an embodiment of the present invention, a sum of a length of the second main portion in the second direction and a length of the first branch portion of the foregoing first interconnection pattern in the second direction is between 20 microns and 150 microns.

In an embodiment of the present invention, the foregoing first interconnection pattern further includes: a second branch portion. The second branch portion is disposed on the second light-emitting diode element, is connected to the second main portion, and extends in the first direction.

In an embodiment of the present invention, a length of the foregoing second branch portion in the first direction is greater than a half of a width of the first electrode of the second light-emitting diode element in the first direction.

In an embodiment of the present invention, a width of the foregoing second branch portion in the second direction is less than a width of the first electrode of the second light-emitting diode element in the second direction.

In an embodiment of the present invention, the foregoing pixel structure further includes: a second interconnection pattern. The second interconnection pattern is disposed on the second electrode of the first light-emitting diode element, is electrically connected to the second electrode of the first light-emitting diode element, and includes a main portion, where the main portion of the second interconnection pattern extends in the first direction.

In an embodiment of the present invention, a width of the main portion of the foregoing second interconnection pattern in the second direction is less than a width of the second electrode of the first light-emitting diode element in the second direction.

In an embodiment of the present invention, the foregoing second interconnection pattern further includes: a branch portion. The branch portion is disposed on the first light-emitting diode element, is connected to the main portion of the second interconnection pattern, and extends in the second direction.

In an embodiment of the present invention, a length of the branch portion of the foregoing second interconnection pattern in the second direction is greater than a half of a width of the second electrode of the first light-emitting diode element in the second direction.

In an embodiment of the present invention, the foregoing pixel structure further includes: a second interconnection pattern and a third interconnection pattern. The second interconnection pattern is disposed on the second electrode of the first light-emitting diode element, is electrically connected to the second electrode of the first light-emitting diode element, and includes a main portion, where the main portion of the second interconnection pattern extends in the first direction. The third interconnection pattern is disposed on a second electrode of the second light-emitting diode element, is electrically connected to a second electrode of the second light-emitting diode element, and includes a main portion, where the main portion of the third interconnection pattern extends in the second direction, and the second interconnection pattern and the third interconnection pattern are electrically connected to each other.

In an embodiment of the present invention, a vertical projection of the foregoing first light-emitting diode element on the substrate includes an area A, the vertical projection of the first light-emitting diode element on the substrate and a vertical projection of the first interconnection pattern on the substrate include an overlapping area A1, the vertical projection of the first light-emitting diode element on the substrate and a vertical projection of the second interconnection pattern on the substrate include an overlapping area A2, and $$\frac{(A1 + A2)}{A} \leq \frac{2}{3}.$$

In an embodiment of the present invention, the first electrode of the foregoing first light-emitting diode element and the first electrode of the second light-emitting diode element are disposed in a mirror image manner, and a second electrode of the first light-emitting diode element and a second electrode of the second light-emitting diode element are disposed in a mirror image manner.

In an embodiment of the present invention, the foregoing first direction and the second direction are perpendicular to each other.

In an embodiment of the present invention, a width of the second main portion of the foregoing first interconnection pattern in the first direction is between 3 microns and 7 microns.

In order to make the aforementioned and other features and advantages of the present invention comprehensible, embodiments accompanied with figures are described in detail below.

DESCRIPTION OF THE EMBODIMENTS

Reference will now be made in detail to the present exemplary embodiments of the present invention, examples of which are illustrated in the accompanying drawings. Wherever possible, the same element numbers are used in the drawings and the description to refer to the same or like parts.

It will be understood that, when an element such as a layer, a film, an area or a substrate is referred to as being "on" or "connected" to another element, the element may be directly on another element, or connected to another element, or there may be an intermediate element. In contrast, when an element is referred to as "directly on" or "directly connected to" another element, there is no intermediate element. As used herein, "connected" may refer to both physical and/or electrical connections. Furthermore, "electrically connected" or "coupling" may be the presence of other elements between two elements.

As used herein, "about," "approximate," or "substantially" includes the values and average values within acceptable ranges of the particular values determined by a person of ordinary skill in the art, in view of the discussed measurements and the specific number of errors associated with the measurements (that is, the limits of the measurement system). For example, "about" may represent within one or more standard deviations of the stated value, or within ±30%, ±20%, ±10%, and ±5%. Furthermore, as used herein, "about", "approximate" or "substantially" may select a more acceptable range or standard deviation depending on optical properties, etching properties or other properties, and may apply all properties without a standard deviation.

Unless otherwise defined, all terms (including technical and scientific terms) used herein have the same meaning as commonly understood by a person of ordinary skill in the art to which the present invention falls in. It will be further understood that terms such as those defined in commonly used dictionaries should be interpreted as having meanings consistent with their meanings in the context of the related art and the present invention, and will not be construed as idealized or excessively formal meaning, unless explicitly defined herein.

Figure 1:
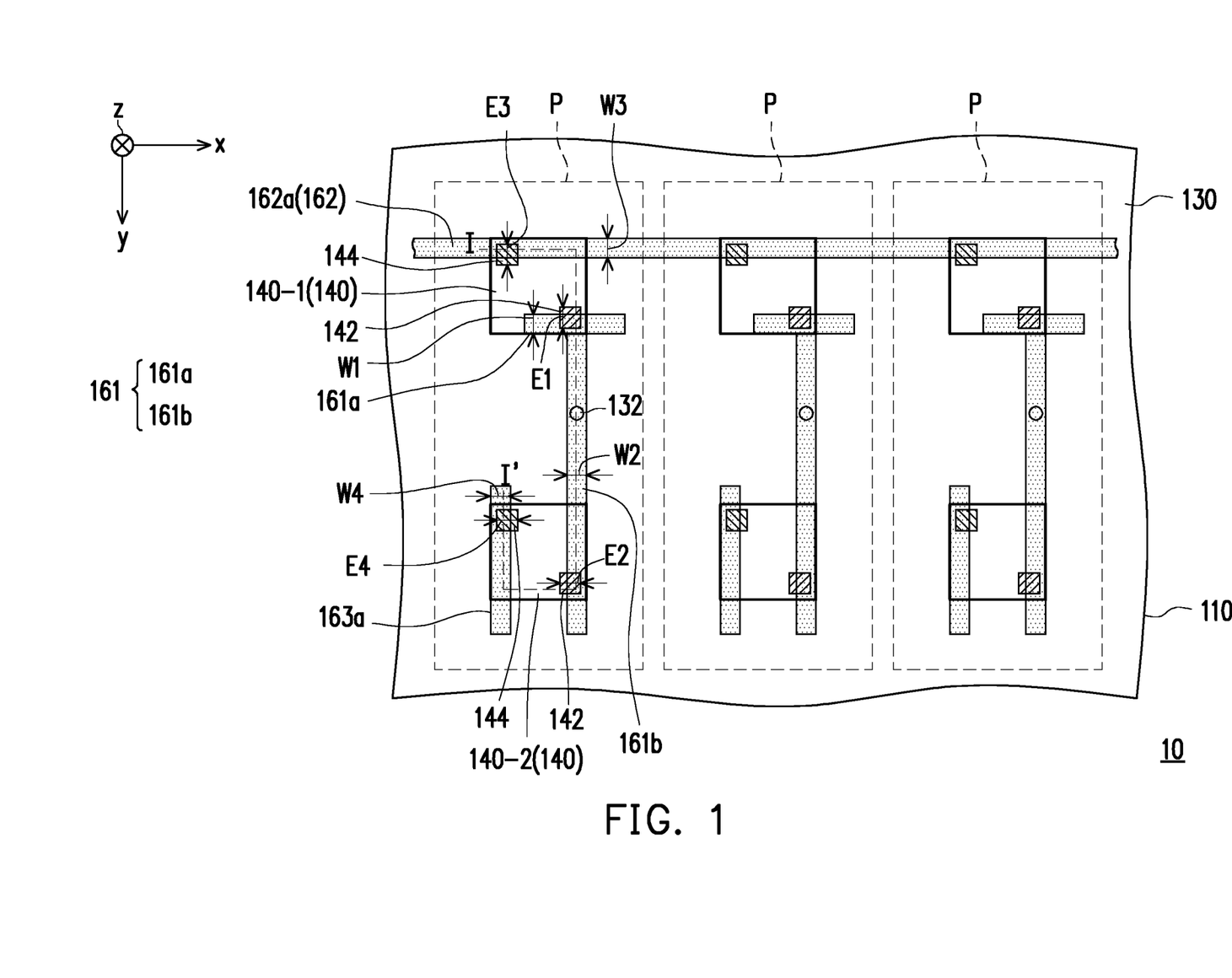
FIG. 1 is a schematic top view of a display device according to an embodiment of the present invention.
Figure 2:
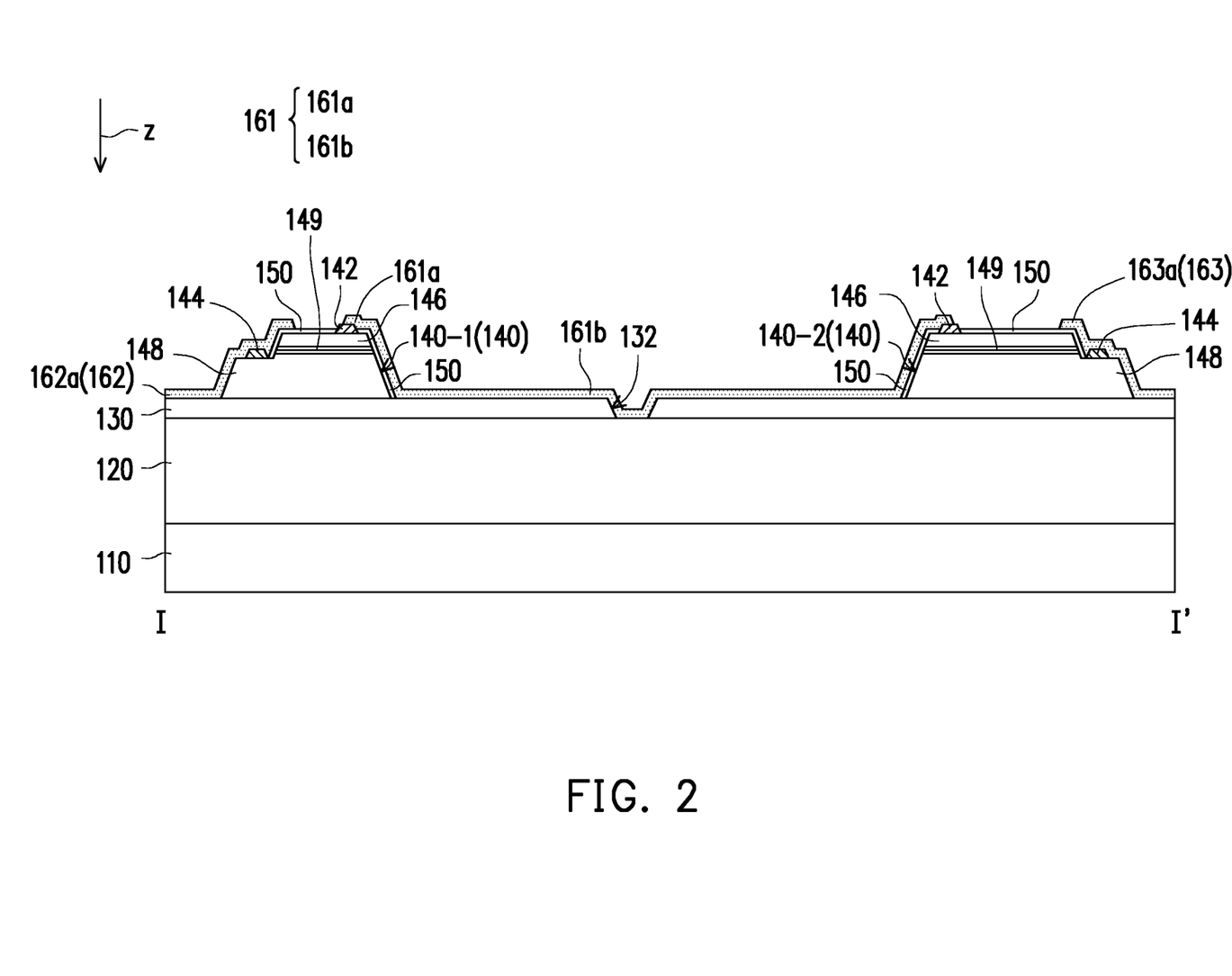
FIG. 2 is a schematic sectional view of a display device according to an embodiment of the present invention.
Figure 3:
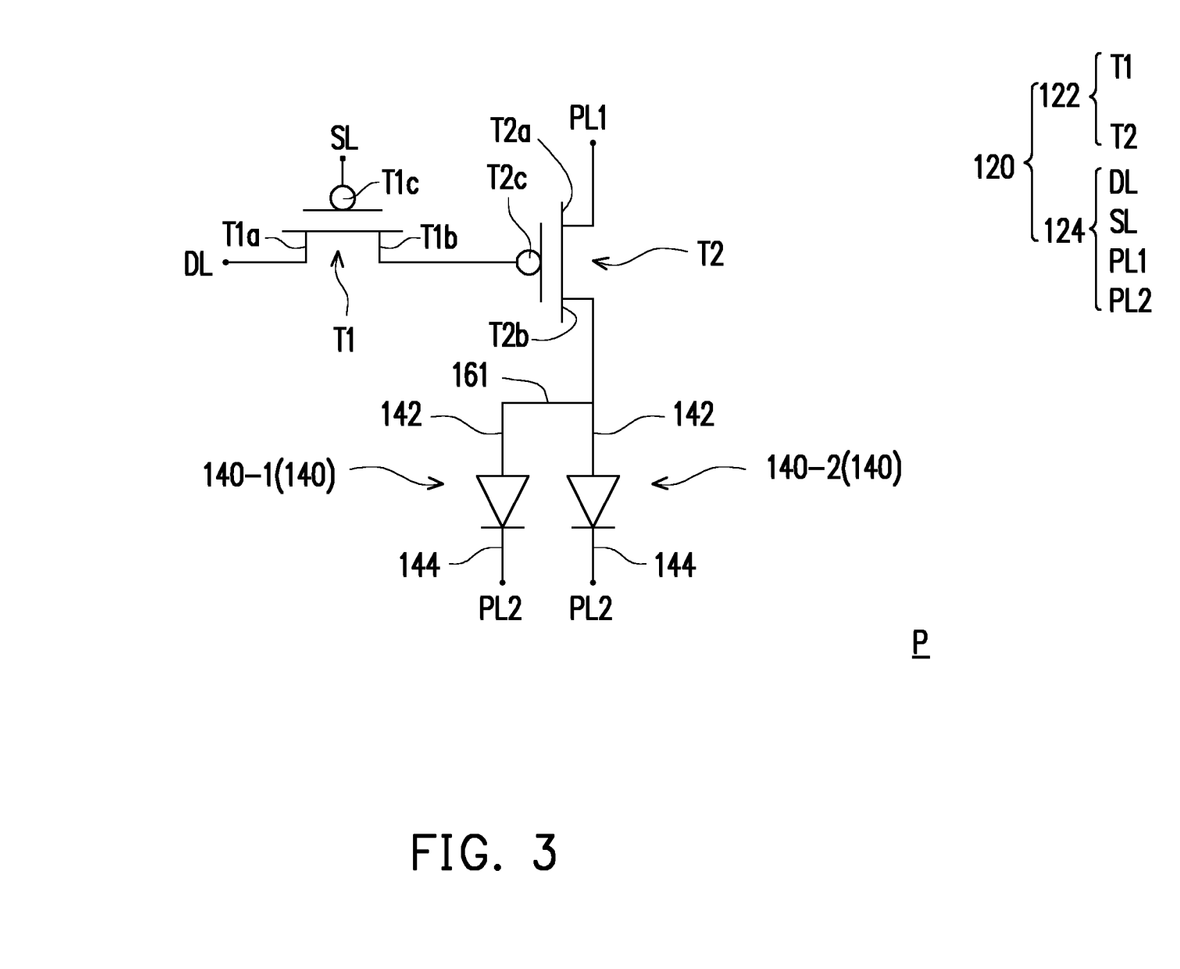
FIG. 3 is an equivalent circuit diagram of a pixel structure of a display device according to an embodiment of the present invention.

FIG. 1 is a schematic top view of a display device according to an embodiment of the present invention. FIG. 2 is a schematic sectional view of a display device according to an embodiment of the present invention. FIG. 2 corresponds to a section line I-I' of FIG. 1. A drive line structure 120 and passivation layers 150 of FIG. 2 are omitted in FIG. 1. FIG. 3 is an equivalent circuit diagram of a pixel structure of a display device according to an embodiment of the present invention.

Referring to FIG. 1 and FIG. 2, a display device 10 includes a substrate 110. The substrate 110 is configured to carry pixel structures P. For example, in the present embodiment, the substrate 110 may be made of glass, quartz, an organic polymer, or an opaque/reflective material (For example: conducting materials, wafers, ceramics, and the like), or other applicable materials.

Referring to FIG. 2 and FIG. 3, in the present embodiment, the display device 10 further includes the drive line structure 120. The drive line structure 120 includes a drive element 122 and a line 124 electrically connected to the drive element 122. For example, in the present embodiment, the drive element 122 may include a first transistor T1 and a second transistor T2, and the line 124 may include a data line DL, a scanning line SL, a first power line PL1, and a second power line PL2, where a first end T1a of the first transistor T1 may be electrically connected to the data line DL, a control end T1c of the first transistor T1 may be electrically connected to the scanning line SL, a second end T1b of the first transistor T1 may be electrically connected to a control end T2c of the second transistor T2, and a first end T2a of the second transistor T2 may be electrically connected to the first power line PL1. However, the present invention is not limited thereto. In other embodiments, the drive line structure 120 may further be in other forms; for example, the drive line structure 120 may further include an integrated circuit (integrated circuits, IC) or an electric control element substrate.

Referring to FIG. 1 and FIG. 2, in the present embodiment, the display device 10 further includes an isolation layer 130. The isolation layer 130 is disposed on the drive line structure 120 and the drive element 122 thereof (shown in FIG. 3), and includes a contact window 132. For example, in the present embodiment, the isolation layer 130 may be formed by curing an adhesive pattern. However, the present invention is not limited thereto.

Referring to FIG. 1 and FIG. 2, the display device 10 includes the plurality of pixel structures P disposed on the substrate 110. Using three pixel structures P shown in FIG. 1 as an example, but the present invention is not limited thereto, the number of the pixel structures P included in the display device 10 may be depending on actual requirements (For example: size and resolution).

Each pixel structure P includes a plurality of light-emitting diode elements 140 electrically connected to each other. The plurality of light-emitting diode elements 140 is disposed above the substrate 110. Each light-emitting diode element 140 includes a first electrode 142 and a second electrode 144. Further, each light-emitting diode element 140 further includes a first-type semiconductor layer 146, a second-type semiconductor layer 148, and an active layer 149, where the first-type semiconductor layer 146 is electrically connected to the first electrode 142, the second-type semiconductor layer 148 is electrically connected to the second electrode 144, and the active layer 149 is disposed between the first-type semiconductor layer 146 and the second-type semiconductor layer 148. For example, in the present embodiment, the first electrode 142 and the second electrode 144 can be disposed on the same side of the second-type semiconductor layer 148; in other words, the light-emitting diode element 140 may be a horizontal light-emitting diode element. However, the present invention is not limited thereto.

Referring to FIG. 2, in the present embodiment, each pixel structure P may further include passivation layers 150. Each passivation layer 150 covers at least a part of the sidewall and a part of the top surface of the light-emitting diode element 140. The passivation layer 150 includes a plurality of openings overlapping the first electrode 142 and the second electrode 144, that is, the passivation layer 150 does not completely cover the first electrode 142 and the second electrode 144.

Referring to FIG. 1 and FIG. 2, each pixel structure P includes a first interconnection pattern 161. The first interconnection pattern 161 is disposed on the first electrode 142 of a first light-emitting diode element 140-1 and the first electrode 142 of a second light-emitting diode element 140-2. The first interconnection pattern 161 is electrically connected to the first electrode 142 of the first light-emitting diode element 140-1 and the first electrode 142 of the second light-emitting diode element 140-2. In other words, the first electrode 142 of the first light-emitting diode element 140-1 and the first electrode 142 of the second light-emitting diode element 140-2 are electrically connected to each other through the first interconnection pattern 161. Referring to FIG. 1, FIG. 2, and FIG. 3, the first interconnection pattern 161 is configured to be electrically connected to the drive element 122 of the drive line structure 120. For example, in the present embodiment, the first interconnection pattern 161 can be electrically connected to the second end T2b of the second transistor T2 through the contact window 132 of the isolation layer 130. However, the present invention is not limited thereto.

Referring to FIG. 1 and FIG. 2, the first interconnection pattern 161 includes a first main portion 161a and a second main portion 161b. The first main portion 161a is disposed on the first electrode 142 of the first light-emitting diode element 140-1, and extends in a first direction x. The second main portion 161b is connected to the first main portion 161a, is disposed on the first electrode 142 of the second light-emitting diode element 140-2, and extends in a second direction y, where the first direction x and the second direction y are crossed. For example, in the present embodiment, the first direction x and the second direction y may be selectively perpendicular to each other, to save layout space and improve a resolution. However, the present invention is not limited thereto. In addition, in the present embodiment, the first main portion 161a of the first interconnection pattern 161 and the contact window 132 of the isolation layer 130 may overlap each other in a vertical projection direction z perpendicular to the substrate 110. However, the present invention is not limited thereto.

It should be noted that, the first interconnection pattern 161 configured to be electrically connected to the first electrode 142 of the first light-emitting diode element 140-1 and the first electrode 142 of the second light-emitting diode element 140-2 includes the first main portion 161a extending in the first direction x and the second main portion 161b extending in the second direction y. Therefore, whether the first light-emitting diode element 140-1 and/or the second light-emitting diode element 140-2 deviates from a preset position in the first direction x, the second direction y, or a combined direction, a success rate at which the first electrode 142 of the first light-emitting diode element 140-1 and the first electrode 142 of the second light-emitting diode element 140-2 can be electrically connected to each other through the first interconnection pattern 161 is increased. In other words, through the foregoing design of the first interconnection pattern 161, the manufacturing yield of the display device 10 can be improved. Alternatively, when a process offset is excessively large, and brightness of the first light-emitting diode element 140-1 and the second light-emitting diode element 140-2 is changed, variations of the first light-emitting diode element 140-1 and the second light-emitting diode element 140-2 in different offset directions can compensate for each other in this design, so that a problem of uneven brightness between different pixels can be improved.

Referring to FIG. 1, in the present embodiment, a width W1 of the first main portion 161a of the first interconnection pattern 161 in the second direction y is less than a width E1 of the first electrode 142 of the first light-emitting diode element 140-1 in the second direction y. A width W2 of the second main portion 161b of the first interconnection pattern 161 in the first direction x is less than a width E2 of the first electrode 142 of the second light-emitting diode element 140-2 in the first direction x. For example, the width W2 of the second main portion 161b of the first interconnection pattern 161 in the first direction x may be between 3 microns and 7 microns. However, the present invention is not limited thereto.

It should be noted that, the width W1 of the first main portion 161a of the first interconnection pattern 161 and/or the width W2 of the second main portion 161b of the first interconnection pattern 161 is small, and therefore, the first interconnection pattern 161 covers a small area of the first light-emitting diode element 140-1 and/or the second light-emitting diode element 140-2, so that a light extraction efficiency of the display device 10 can be improved.

Referring to FIG. 1, in the present embodiment, the pixel structure P further includes a second interconnection pattern 162. The second interconnection pattern 162 is disposed on the second electrode 144 of the first light-emitting diode element 140-1, is electrically connected to the second electrode 144 of the first light-emitting diode element 140-1, and includes a main portion 162a, where the main portion 162a of the second interconnection pattern 162 extends in the first direction x. In the present embodiment, a width W3 of the main portion 162a of the second interconnection pattern 162 in the second direction y may be less than a width E3 of the second electrode 144 of the first light-emitting diode element 140-1 in the second direction y. Similarly, the width W3 of the main portion 162a of the second interconnection pattern 162 is small, and therefore, the second interconnection pattern 162 covers a small area of the first light-emitting diode element 140-1, so that the light extraction efficiency of the display device 10 can be improved.

Further, in the present embodiment, a vertical projection of the first light-emitting diode element 140-1 on the substrate 100 includes an area A, the vertical projection of the first light-emitting diode element 140-1 on the substrate 110 and a vertical projection of the first interconnection pattern 161 on the substrate 110 include an overlapping area A1, the vertical projection of the first light-emitting diode element 140-1 on the substrate 110 and a vertical projection of the second interconnection pattern 162 on the substrate 110 include an overlapping area A2, and $$\frac{(A1+A2)}{A} \leq \frac{2}{3}.$$

However, the present invention is not limited thereto.

Referring to FIG. 1, in the present embodiment, the pixel structure P further includes a third interconnection pattern 163. The third interconnection pattern 163 is disposed on the second electrode 144 of the second light-emitting diode element 140-2, is electrically connected to the second electrode 144 of the second light-emitting diode element 140-2, and includes a main portion 163a, where the main portion 163a of the third interconnection pattern 163 extends in the second direction y. The second interconnection pattern 162 and the third interconnection pattern 163 are electrically connected to each other. Referring to FIG. 1, FIG. 2, and FIG. 3, for example, in the present embodiment, the second electrode 144 of the first light-emitting diode element 140-1 and the second electrode 144 of the second light-emitting diode element 140-2 can be electrically connected to the second power line PL2 through the second interconnection pattern 162 and the third interconnection pattern 163.

Referring to FIG. 1, in the present embodiment, the first interconnection pattern 161, the second interconnection pattern 162, and the third interconnection pattern 163 can be selectively formed on the same film layer (for example, but not limited to a transparent conductive layer). Materials of the first interconnection pattern 161, the second interconnection pattern 162, and/or the third interconnection pattern 163 are selected to have low resistivity and high transmittance. For example, the materials include, but do not limited to: indium tin oxide, indium zinc oxide, aluminum tin oxide, aluminum zinc oxide, indium germanium zinc oxide, or other suitable oxide, or a stacked layer of at least two of the foregoing.

In the present embodiment, a width W4 of the main portion 163a of the third interconnection pattern 163 in the first direction x may be less than a width E4 of the second electrode 144 of the second light-emitting diode element 140-2 in the first direction x. Similarly, the width W4 of the main portion 163a of the third interconnection pattern 163 is small, and therefore, the third interconnection pattern 163 covers a small area of the second light-emitting diode element 140-2, so that the light extraction efficiency of the display device 10 can be improved.

For example, in the present embodiment, a vertical projection of the second light-emitting diode element 140-2 on the substrate 110 includes an area B, the vertical projection of the second light-emitting diode element 140-2 on the substrate 110 and a vertical projection of the first interconnection pattern 161 on the substrate 110 include an overlapping area B1, the vertical projection of the second light-emitting diode element 140-2 on the substrate 110 and a vertical projection of the third interconnection pattern 163 on the substrate 110 include an overlapping area B2, and $$\frac{(A1+A2)}{A} \leq \frac{2}{3}.$$

However, the present invention is not limited thereto.

Figure 4:
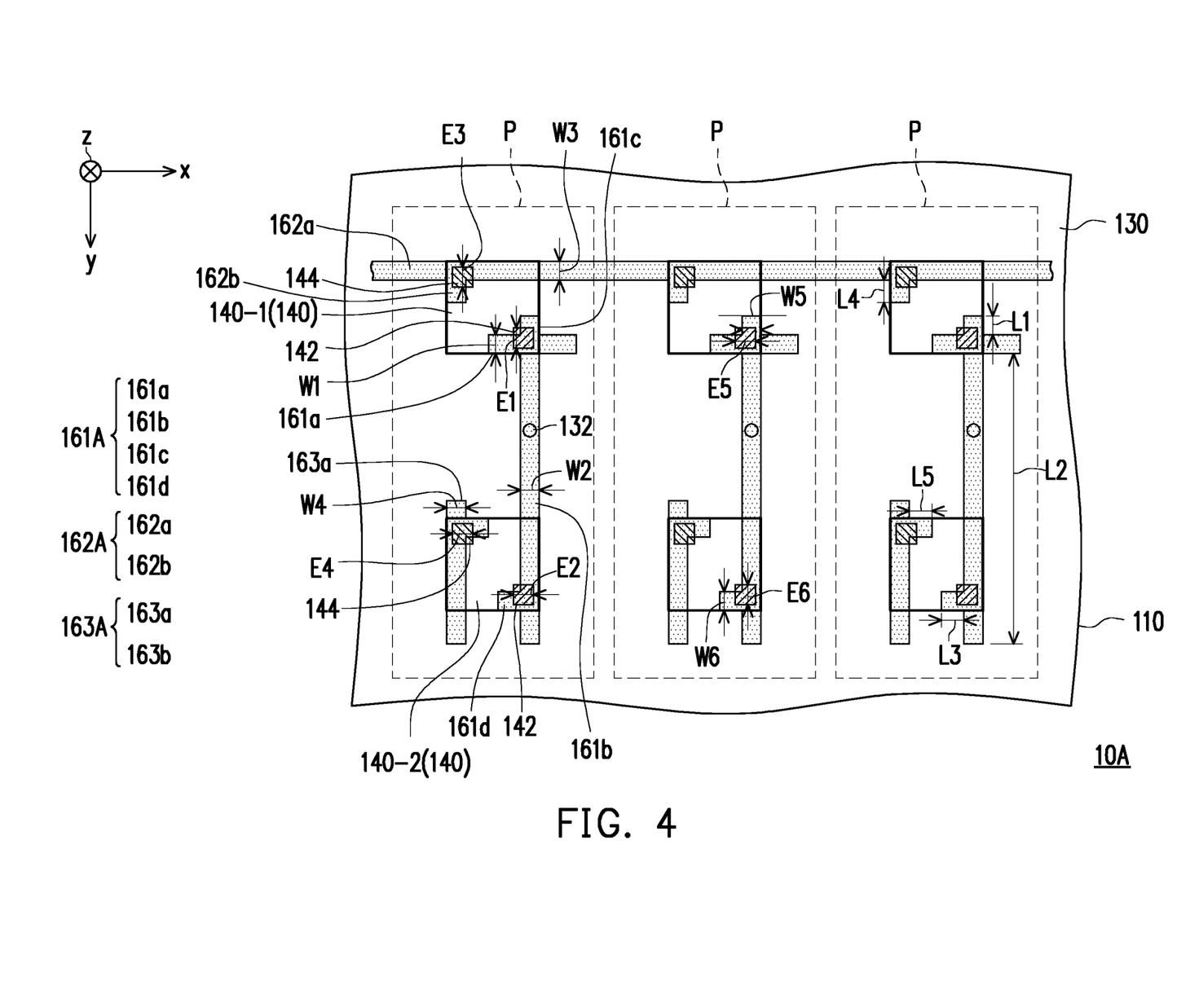
FIG. 4 is a schematic top view of a display device according to another embodiment of the present invention.

FIG. 4 is a schematic top view of a display device according to another embodiment of the present invention. A display device 10A of FIG. 4 is similar to the display device 10 of FIG. 1. A difference between the two is as follows, and reference is made to the foregoing description for the same or similarities.

A first interconnection pattern 161A of the display device 10A further includes a first branch portion 161c. The first branch portion 161c is disposed on the first light-emitting diode element 140-1, and extends in the second direction y, where the first main portion 161*a* is connected between the first branch portion 161*c* and the second main portion 161*b*. In the present embodiment, a width W5 of the first branch portion 161*c* in the first direction x is less than a width E5 of the first electrode 142 of the first light-emitting diode element 140-1 in the first direction x. A length L1 of the first branch portion 161*c* in the second direction y is greater than a half of the width E1 of the first electrode 142 of the first light-emitting diode element 140-1 in the second direction y. In the present embodiment, the first branch portion 161*c* and the second main portion 161*b* of the first interconnection pattern 161A respectively include the length L1 and a length L2 in the second direction y. A sum (L1+L2) of the length L1 and the length L2 may be between 20 microns to 150 microns. However, the present invention is not limited thereto.

The first interconnection pattern 161A of the display device 10A further includes a second branch portion 161*d*. The second branch portion 161*d* is disposed on the second light-emitting diode element 140-2, is connected to the second main portion 161*b*, and extends in the first direction x. In the present embodiment, a length L3 of the second branch portion 161*d* in the first direction x is greater than a half of the width E2 of the first electrode 142 of the second light-emitting diode element 140-2 in the first direction x. A width W6 of the second branch portion 161*d* in the second direction y is less than a width E6 of the first electrode 142 of the second light-emitting diode element 140-2 in the second direction y.

The second interconnection pattern 162A of the display device 10A further includes a branch portion 162*b*. The branch portion 162*b* is disposed on the first light-emitting diode element 140-1, is connected to the main portion 162*a* of the second interconnection pattern 162A, and extends in the second direction y. A length L4 of the branch portion 162*b* of the second interconnection pattern 162A in the second direction y is greater than a half of the width E3 of the second electrode 144 of the first light-emitting diode element 140-1 in the second direction y.

A third interconnection pattern 163A of a branch portion 163*b*A of the display device 10 further includes a branch portion 163*b*. The branch portion 163*b* is disposed on the second light-emitting diode element 140-2, is connected to the main portion 163*a* of the third interconnection pattern 163A, and extends in the first direction x. A length L5 of the branch portion 163*b* of the third interconnection pattern 163A in the first direction x is greater than a half of the width E4 of the second electrode 144 of the second light-emitting diode element 140-2 in the first direction x.

Through the first branch portion 161*c*, the second branch portion 161*d*, the branch portion 162*b* and/or the branch portion 163*b*, even if the first light-emitting diode element 140-1 and/or the second light-emitting diode element 140-2 deviate from a preset position in the first direction x, the second direction y, or the combined direction to a larger extent, the first electrode 142 and the second electrode 144 of the first light-emitting diode element 140-1 and the first electrode 142 and the second electrode 144 of the second light-emitting diode element 140-2 can still be electrically connected to the first interconnection pattern 161A, the second interconnection pattern 162A, and/or the third interconnection pattern 163A.

Figure 5:
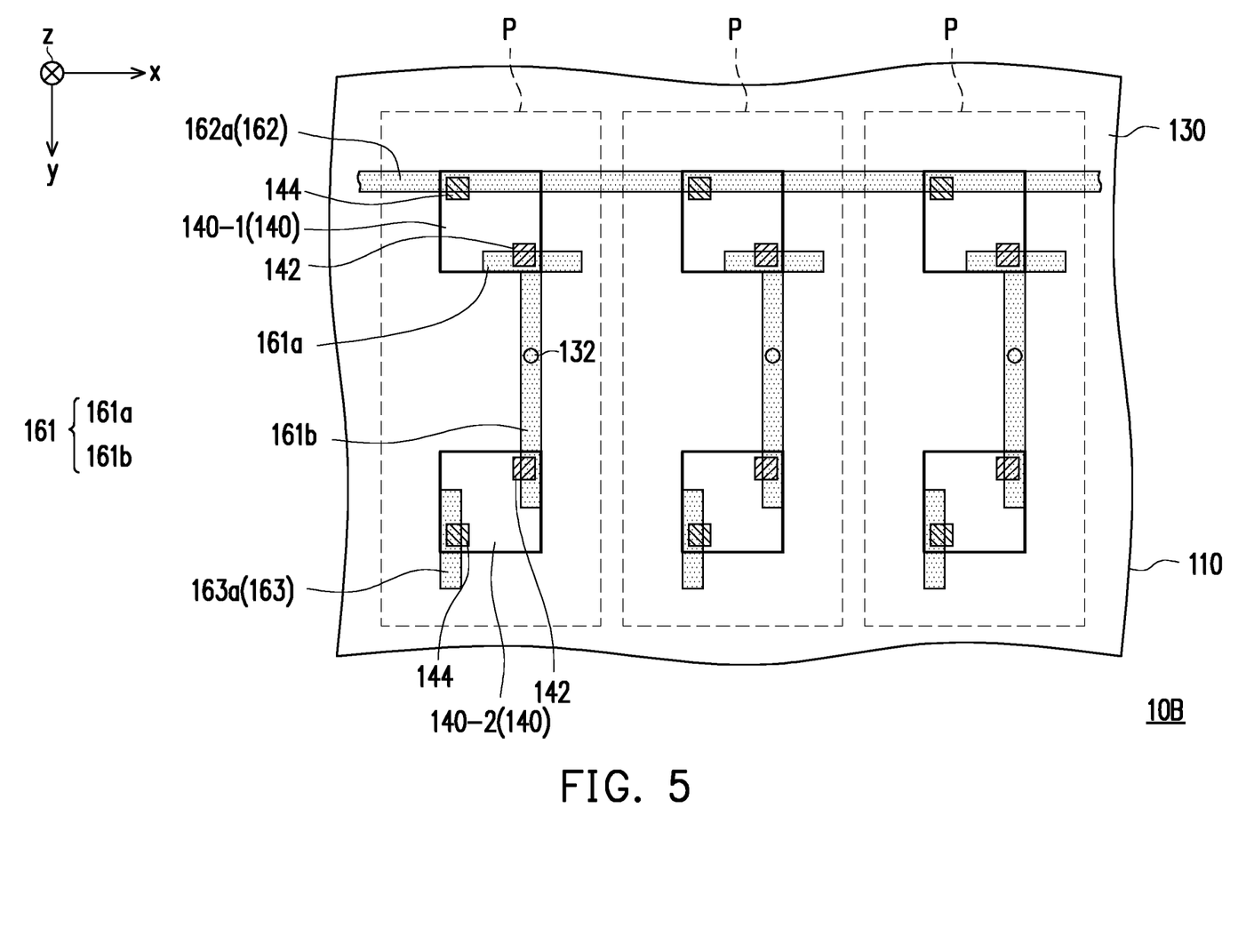
FIG. 5 is a schematic top view of a display device according to a further embodiment of the present invention.

FIG. 5 is a schematic top view of a display device according to a further embodiment of the present invention. A display device 10B of FIG. 5 is similar to the display device 10 of FIG. 1. A difference between the two is that: in an embodiment of FIG. 5, the first electrode 142 of the first light-emitting diode element 140-1 and the first electrode 142 of the second light-emitting diode element 140-2 may be disposed in a mirror image manner, and the second electrode 144 of the first light-emitting diode element 140-1 and the second electrode 144 of the second light-emitting diode element 140-2 may be disposed in a mirror image manner. In this way, a layout area of the first interconnection pattern 161, the second interconnection pattern 162, and/or the third interconnection pattern 163 can be decreased, so that the light extraction efficiency of the display device 10B can be improved.

Figure 6:
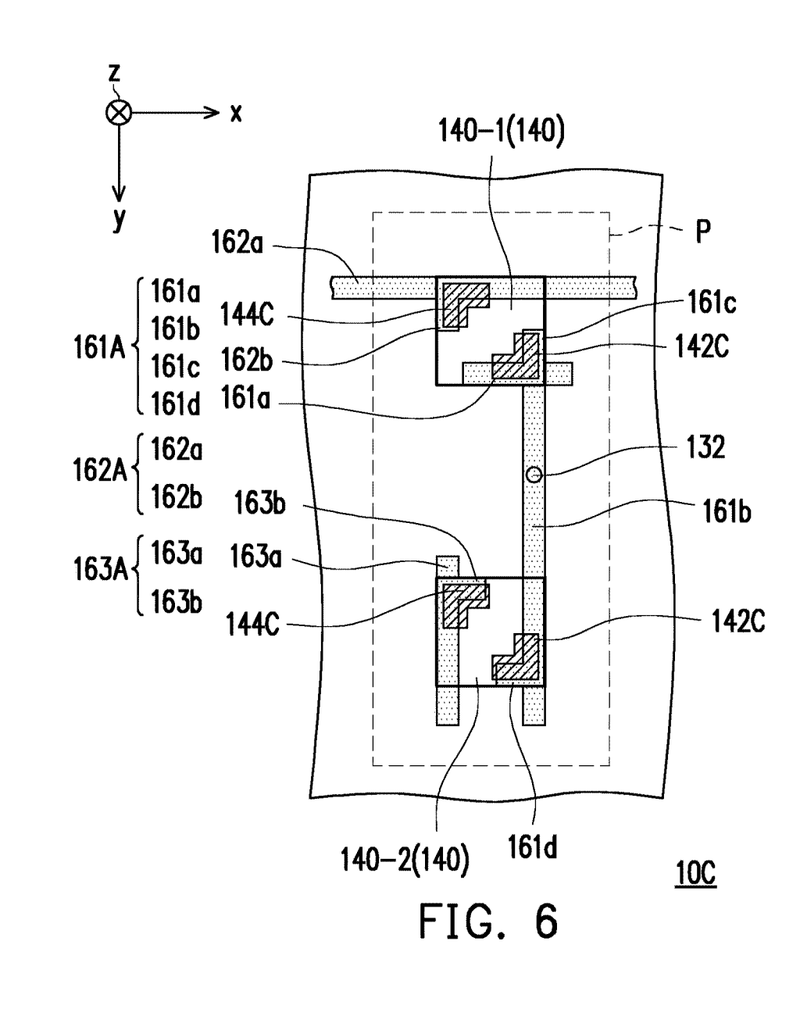
FIG. 6 is a schematic top view of a pixel structure of a display device according to still another embodiment of the present invention.

FIG. 6 is a schematic top view of a pixel structure of a display device according to still another embodiment of the present invention. A display device 10C of FIG. 6 is similar to the display device 10A of FIG. 4. A difference between the two is that: in an embodiment of FIG. 4, the first electrode 142 and the second electrode 144 of the light-emitting diode element 140 may be square. In an embodiment of FIG. 6, a first electrode 142C and a second electrode 144C of the light-emitting diode element 140 may be L-shaped, so that the first electrode 142 and the second electrode 144 are better electrically connected to the first interconnection pattern 161A, the second interconnection pattern 162A, and/or the third interconnection pattern 163A, and the like.

Figure 7:
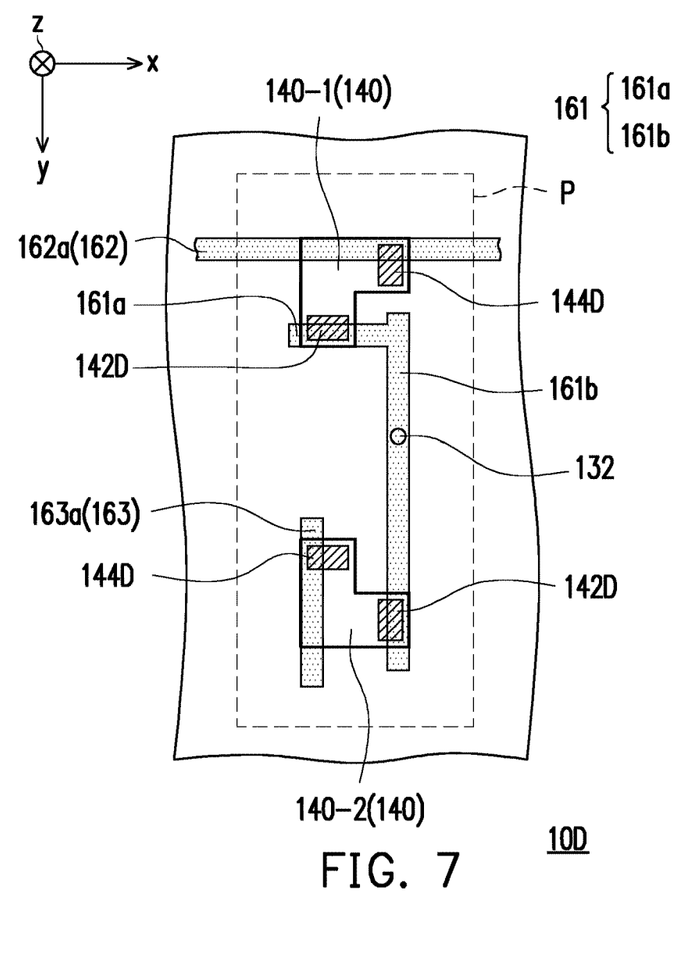
FIG. 7 is a schematic top view of a pixel structure of a display device according to an embodiment of the present invention.

FIG. 7 is a schematic top view of a pixel structure of a display device according to an embodiment of the present invention. A display device 10D of FIG. 7 is similar to the display device 10A of FIG. 4. A difference between the two is that: in an embodiment of FIG. 7, a first electrode 142D and a second electrode 144D of the light-emitting diode element 140 may be rectangular.

It should be noted that, shapes of the first electrode and the second electrode of the light-emitting diode element are merely to illustrate the present invention and are not intended to limit the present invention. In other embodiments, the first electrode and/or the second electrode of the light-emitting diode element can be further designed in other shapes, and shapes of the first interconnection pattern, the second interconnection pattern, and/or the third interconnection pattern can be adjusted accordingly.

Although the present invention is disclosed above by using the embodiments, the embodiments are not intended to limit the present invention. Any person of ordinary skill in the art can make various variations and modifications without departing from the spirit and the scope of the present invention. Therefore, the protection scope of the present invention shall be subject to the appended claims.

What is claimed is:
1. A pixel structure, comprising:
 a plurality of light-emitting diode elements, disposed above a substrate, wherein the light-emitting diode elements comprise a first light-emitting diode element and a second light-emitting diode element, and each light-emitting diode element comprises a first electrode and a second electrode; and
 a first interconnection pattern, disposed on the first electrode of the first light-emitting diode element and the first electrode of the second light-emitting diode element, wherein the first interconnection pattern is electrically connected to the first electrode of the first light-emitting diode element and the first electrode of the second light-emitting diode element, the first interconnection pattern is configured to be electrically connected to a drive element, and the first interconnection pattern comprises:

a first main portion, disposed on the first electrode of the first light-emitting diode element, and extending in a first direction;

a second main portion, connected to the first main portion, disposed on the first electrode of the second light-emitting diode element, and extending in a second direction, wherein the first direction and the second direction are crossed; and a second interconnection pattern, disposed on the second electrode of the first light-emitting diode element, electrically connected to the second electrode of the first light-emitting diode element, and comprising a main portion, wherein the main portion of the second interconnection pattern extends in the first direction, wherein a vertical projection of the first light-emitting diode element on the substrate comprises an area A, the vertical projection of the first light-emitting diode element on the substrate and a vertical projection of the first interconnection pattern on the substrate comprise an overlapping area A1, the vertical projection of the first light-emitting diode element on the substrate and a vertical projection of the second interconnection pattern on the substrate comprise an overlapping area A2, and $$\frac{(A1+A2)}{A} \leq \frac{2}{3}.$$

2. The pixel structure according to claim 1, further comprising:

an isolation layer, disposed on the drive element, and comprising a contact window, wherein the light-emitting diode elements are disposed on the isolation layer, the first interconnection pattern is electrically connected to the drive element through the contact window, and the contact window overlaps with the first main portion of the first interconnection pattern in a vertical projection direction perpendicular to the substrate.

3. The pixel structure according to claim 1, wherein a width of the second main portion of the first interconnection pattern in the first direction is less than a width of the first electrode of the second light-emitting diode element in the first direction.

4. The pixel structure according to claim 3, wherein a width of the first main portion of the first interconnection pattern in the second direction is less than a width of the first electrode of the first light-emitting diode element in the second direction.

5. The pixel structure according to claim 1, wherein the first interconnection pattern further comprises:

a first branch portion, disposed on the first light-emitting diode element, and extending in the second direction, wherein the first main portion is connected between the first branch portion and the second main portion.

6. The pixel structure according to claim 5, wherein a width of the first branch portion in the first direction is less than a width of the first electrode of the first light-emitting diode element in the first direction.

7. The pixel structure according to claim 5, wherein a length of the first branch portion in the second direction is greater than a half of a width of the first electrode of the first light-emitting diode element in the second direction.

8. The pixel structure according to claim 5, wherein a sum of a length of the second main portion in the second direction and a length of the first branch portion of the first interconnection pattern in the second direction is between 20 microns and 150 microns.

9. The pixel structure according to claim 5, wherein the first interconnection pattern further comprises:

a second branch portion, disposed on the second light-emitting diode element, connected to the second main portion, and extending in the first direction.

10. The pixel structure according to claim 9, wherein a length of the second branch portion in the first direction is greater than a half of a width of the first electrode of the second light-emitting diode element in the first direction.

11. The pixel structure according to claim 9, wherein a width of the second branch portion in the second direction is less than a width of the first electrode of the second light-emitting diode element in the second direction.

12. The pixel structure according to claim 1, wherein a width of the main portion of the second interconnection pattern in the second direction is less than a width of the second electrode of the first light-emitting diode element in the second direction.

13. The pixel structure according to claim 1, wherein the second interconnection pattern further comprises:

a branch portion, disposed on the first light-emitting diode element, connected to the main portion of the second interconnection pattern, and extending in the second direction.

14. The pixel structure according to claim 13, wherein a length of the branch portion of the second interconnection pattern in the second direction is greater than a half of a width of the second electrode of the first light-emitting diode element in the second direction.

15. The pixel structure according to claim 1, further comprising:

a third interconnection pattern, disposed on a second electrode of the second light-emitting diode element, electrically connected to a second electrode of the second light-emitting diode element, and comprising a main portion, wherein the main portion of the third interconnection pattern extends in the second direction, and the second interconnection pattern and the third interconnection pattern are electrically connected to each other.

16. The pixel structure according to claim 1, wherein the first electrode of the first light-emitting diode element and the first electrode of the second light-emitting diode element are disposed in a mirror image manner, and a second electrode of the first light-emitting diode element and a second electrode of the second light-emitting diode element are disposed in a mirror image manner.

17. The pixel structure according to claim 1, wherein the first direction and the second direction are perpendicular to each other.

18. The pixel structure according to claim 1, wherein a width of the second main portion of the first interconnection pattern in the first direction is between 3 microns and 7 microns.

19. The pixel structure according to claim 1, wherein the first main portion and the second main portion are directly connected.

* * * * *